United States Patent
Gu et al.

(10) Patent No.: US 12,532,451 B2
(45) Date of Patent: Jan. 20, 2026

(54) DRAM TRANSISTOR INCLUDING HORIZONAL BODY CONTACT

(71) Applicant: Applied Materials, Inc., Santa Clara, CA (US)

(72) Inventors: Sipeng Gu, Clifton Park, NY (US); Qintao Zhang, Mt. Kisco, NY (US)

(73) Assignee: Applied Materials, Inc., Santa Clara, CA (US)

( * ) Notice: Subject to any disclaimer, the term of this patent is extended or adjusted under 35 U.S.C. 154(b) by 524 days.

(21) Appl. No.: 18/061,733

(22) Filed: Dec. 5, 2022

(65) Prior Publication Data
US 2024/0188279 A1    Jun. 6, 2024

(51) Int. Cl.
*H10B 12/00*    (2023.01)

(52) U.S. Cl.
CPC ............ *H10B 12/20* (2023.02); *H10B 12/01* (2023.02)

(58) Field of Classification Search
CPC ................................ H10B 12/20; H10B 12/01
See application file for complete search history.

(56) References Cited

U.S. PATENT DOCUMENTS

| | | | |
|---|---|---|---|
| 2020/0027733 A1 | 1/2020 | Hautala | |
| 2020/0273967 A1* | 8/2020 | Reznicek | H01L 21/28123 |
| 2021/0324519 A1 | 10/2021 | Hautala | |
| 2023/0215945 A1* | 7/2023 | Ogura | H10D 62/127 |
| | | | 257/330 |

FOREIGN PATENT DOCUMENTS

DE    102019115490 B4 *  10/2022  ............. B82Y 10/00

OTHER PUBLICATIONS

Cho et al., "Suppression of the Floating-Body Effect of Vertical-Cell DRAM With the Buried Body Engineering Method", IEEE Transactions on Electron Devices, vol. 65, No. 8, Aug. 2018, pp. 3237-3242.
Chung et al., "Novel 4F2 DRAM Cell with Vertical Pillar Transistor(VPT)", 78-1-4577-0708-7/11, pp. 211-214.
Vandana B., "Study of Floating Body Effect in SOI Technology", International Journal of Modern Engineering Research (IJMER), www.ijmer.com vol. 3, Issue. 3, May-Jun. 2013, ISSN: 2249-6645, pp. 1817-1824.

* cited by examiner

*Primary Examiner* — Edward Chin
(74) *Attorney, Agent, or Firm* — KDW Firm PLLC (57) ABSTRACT

Disclosed herein are approaches for forming a dynamic random-access memory device (DRAM). One DRAM device may include plurality of pillars extending from a base layer, and a spacer layer formed along just a lower portion of each of the plurality of pillars. The DRAM further includes a body contact and a cap between the plurality of pillars, wherein the body contact is formed over the spacer layer, and a gate formed around the plurality of pillars. The DRAM further includes a bottom source/drain formed in the base layer and a top source/drain formed in each pillar of the plurality of pillars, wherein the top source/drain extends above the gate.

14 Claims, 14 Drawing Sheets

DRAM TRANSISTOR INCLUDING HORIZONAL BODY CONTACT

FIELD OF THE DISCLOSURE

The present disclosure relates to semiconductor structures and, more particularly, to a dynamic random-access memory (DRAM) transistor including horizontal body contacts.

BACKGROUND OF THE DISCLOSURE

As dynamic random-access memory (DRAM) devices scale to smaller dimensions, an increasing emphasis is placed on patterning for forming three dimensional structures, including trenches for storage nodes as well as access transistors. In current DRAM devices, transistors may be formed using narrow and tall, vertical semiconductor fin structures, often made from monocrystalline silicon. In accordance with current trends, the aspect ratio of such fin structures, meaning the height (depth) of a fin divided by the spacing between adjacent fins, may reach 20:1 or more in the coming years.

In an effort to continue scaling smaller, $4F^2$ DRAM devices have been developed. However, current $4F^2$ DRAM devices have off-leakage current issues for vertical channel transistors. The off-leakage current is caused by the floating body effect caused by hole accumulation into the body of the $4F^2$ DRAM device.

It is with respect to these and other drawbacks of the current art that the present disclosure is provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a device may include a plurality of pillars extending from a base layer, a spacer layer formed along just a lower portion of each of the plurality of pillars, and a body contact and a cap between the plurality of pillars, wherein the body contact is formed over the spacer layer. The device may further include a gate formed around the plurality of pillars, and a bottom source/drain formed in the base layer and a top source/drain formed in each pillar of the plurality of pillars, wherein the top source/drain extends above the gate.

In another aspect, a dynamic random-access memory device may include a plurality of pillars extending from a base layer, a spacer layer formed along just a lower portion of each of the plurality of pillars, and a body contact and a cap between the plurality of pillars, wherein the body contact is formed over the spacer layer, and wherein the body contact is in direct physical contact with an upper portion of each of the plurality of pillars. The dynamic random-access memory device may further include a gate formed around the plurality of pillars, and a bottom source/ drain formed in the base layer and a top source/drain formed in each pillar of the plurality of pillars, wherein the top source/drain extends above the gate.

In yet another aspect, a method of forming a dynamic random-access memory transistor may include etching a section of a spacer layer from an inner portion of each of a plurality of pillars by delivering ions to the spacer layer at a non-zero angle relative to a perpendicular extending from an upper surface of the plurality of pillars, and forming a body contact and a cap between the plurality of pillars. The method may further include removing the spacer layer from an upper surface of a base layer, wherein the plurality of pillars extend vertically from the base layer, and forming a bottom source/drain (S/D) in the base layer by delivering a dopant into the top surface of the base layer. The method may further include forming a gate atop the upper surface of the base layer, wherein the gate is formed around the plurality of pillars, and forming a top S/D in the plurality of pillars by implanting the plurality of pillars remaining exposed above the gate.

BRIEF DESCRIPTION OF THE DRAWINGS

The accompanying drawings illustrate exemplary approaches of the disclosure, including the practical application of the principles thereof, as follows.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Devices, DRAM transistors, and methods in accordance with the present disclosure will now be described more fully hereinafter with reference to the accompanying drawings, where various embodiments are shown. The devices, DRAM transistors, and methods may be embodied in many different forms and are not to be construed as being limited to the embodiments set forth herein. Instead, these embodiments are provided so the disclosure will be thorough and complete, and will fully convey the scope of the methods to those skilled in the art.

To address the deficiencies of the prior art described above, disclosed herein are methods and devices (e.g., $4F^2$ vertical DRAM transistors) including an in-situ doped polysilicon body contact formed between a plurality of vertical pillars, which may be partially exposed during processing using a direction etch. The device may include a bottom source/drain (S/D) formed in a base, and a top S/D formed in each of the plurality of vertical pillars. The bottom S/D can be heavily doped, thus lowering contact resistance.

Prior art devices require bottom S/D to provide a hollow region to connect the body to substrate, and the bottom S/D doping has to be shallow, or only partial doped, which degrades transistor performance. Advantageously, embodiments of the present disclosure provide a polysilicon body contact, which disassociates bottom S/D design from floating-body issues. All S/D doping schemes, such as lightly doped drain (LDD) and/or dopant segregated Schottky (DSS), can be applied on the bottom S/D, thus improving performance. Furthermore, the novel horizontal structure of the polysilicon body contact provides a h/e flow in/out path, thus eliminating floating-body issues.

Figure 1A:
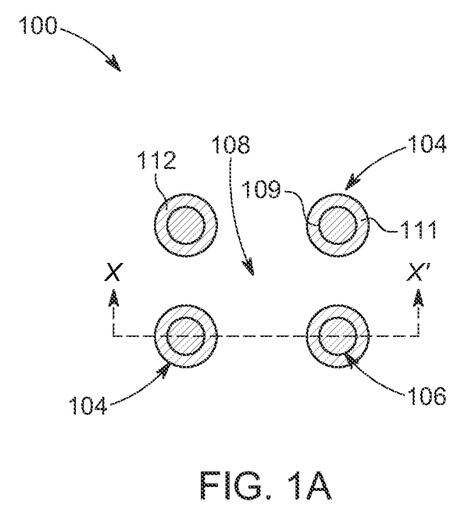
FIG. 1A illustrates a top view of a device, such as a DRAM device, including a spacer layer formed over a plurality of pillars, according to embodiments of the present disclosure.
Figure 1B:
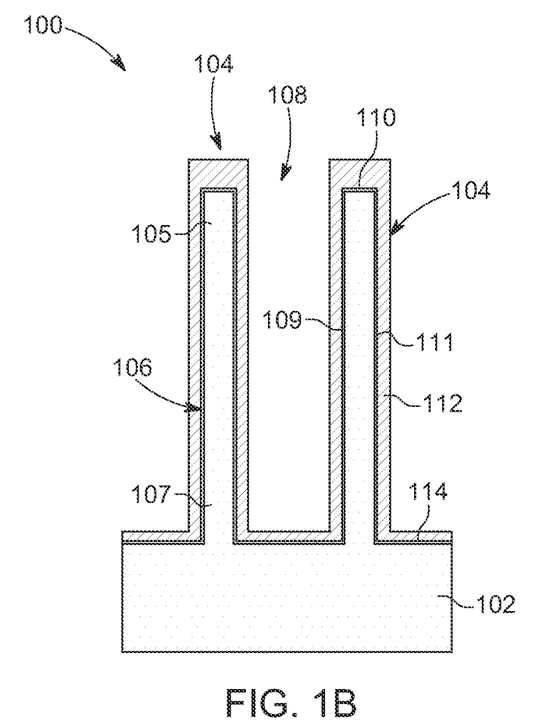
FIG. 1B illustrates a cross-sectional side view of the device of FIG. 1A along cutline X-X', according to embodiments of the present disclosure.

FIG. 1A illustrates a top view of a device 100, such as a DRAM device, while FIG. 1B illustrates a cross-sectional side view of the device 100 of FIG. 1A along cutline X-X'. As shown, the device 100 may include a base layer 102 (e.g., substrate) and a plurality of pillars 104 extending vertically from the base layer 102. Although non-limiting, the plurality of pillars 104 may each have a cylindrical shape defined by a sidewall 106 and an upper surface 110. The sidewall 106 may include an upper portion 105, a lower portion 107, an inner portion 109, an exterior portion 111. The plurality of pillars 104 may further define a central trench 108 extending therebetween. Although only four (4) pillars 104 are shown for the sake of simplicity, it will be appreciated that a much greater number of pillars 104 may be present across the device 100.

As further shown, the device 100 may include a spacer layer 112 formed over the pillars 104 and over an upper surface 114 of the base layer 102. As shown, the spacer layer 112 may have a greater thickness along the upper surface 110 than along the sidewall 106. In other embodiments, the spacer layer 112 may be thicker along the upper surface 114 of the base layer 102 to satisfy S/D to body breakdown voltage requirements. The spacer layer 112 may a dummy silicon oxide (SiO)/silicon nitride (SiN) deposited over all exposed surfaces of the base layer 102 and the pillars 104.

Figure 2A:
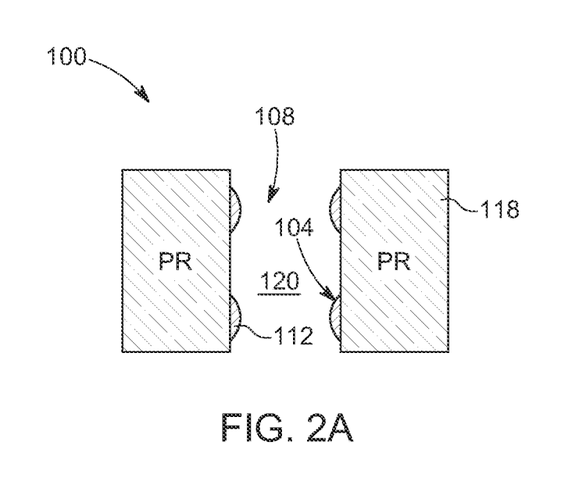
FIG. 2A illustrates a top view of the device following formation of a hardmask and photoresist, according to embodiments of the present disclosure.
Figure 2B:
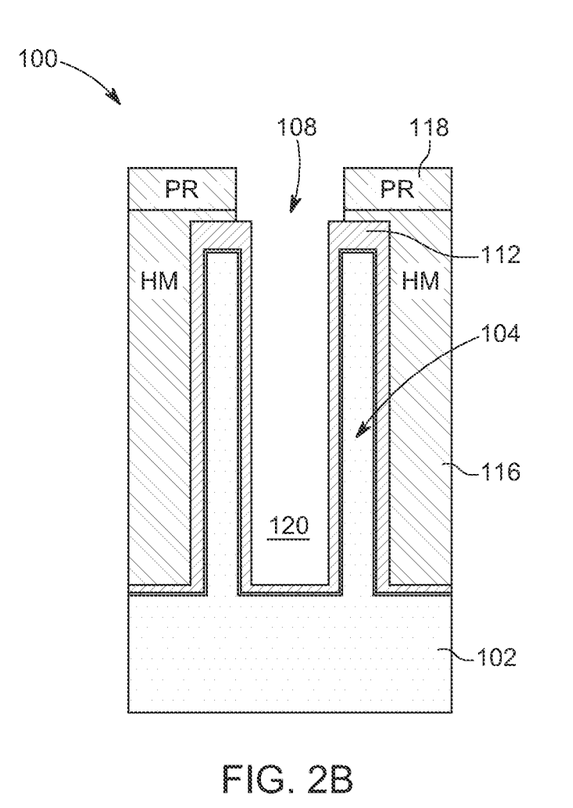
FIG. 2B illustrates a cross-sectional side view of the device of FIG. 2A, according to embodiments of the present disclosure.

FIGS. 2A-2B illustrate the device 100 following formation of a hardmask 116 and photoresist 118, according to embodiments of the present disclosure. As shown, the hardmask 116 may be formed over the spacer layer 112, and the photoresist 118 may be formed over the hardmask 116. The hardmask 116 may be patterned (e.g., etched) to open a body contact area 120 in the central trench 108, between the pillars 104.

Figure 3A:
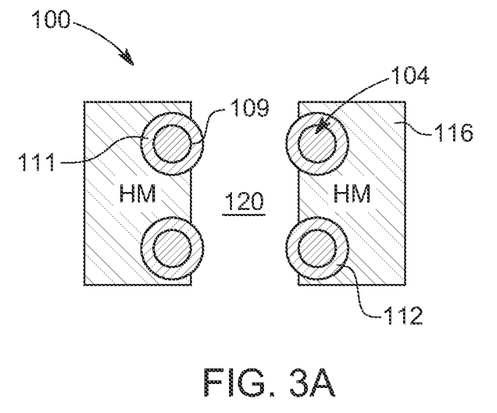
FIG. 3A illustrates a top view of the device following an etch process to remove a portion of the spacer layer, according to embodiments of the present disclosure.
Figure 3B:
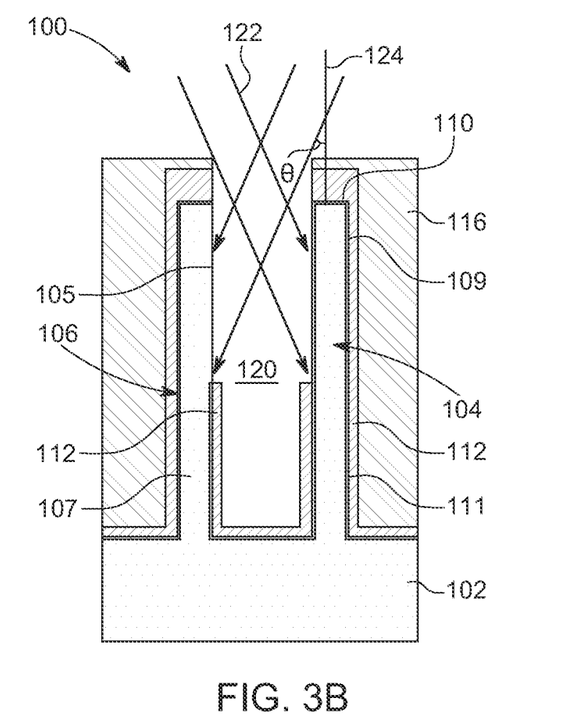
FIG. 3B illustrates a cross-sectional side view of the device of FIG. 3A, according to embodiments of the present disclosure.

FIGS. 3A-3B illustrate the device 100 following an etch process to remove a portion of the spacer layer 112, according to embodiments of the present disclosure. As shown, the photoresist 118 may be removed, and a plurality of ions 122 may be delivered to the spacer layer 112 at a non-zero angle 'O' relative to a perpendicular 124 extending from the upper surface 110 of the pillars 104. More specifically, the spacer layer 112 may be removed from the upper portion 105 of each of the pillars 104 without removing the spacer layer 112 from the lower portion 107 of the pillars 104. Because the hardmask 116 remains present over the device 100 during the etch process, only the inner portion 109 of the sidewall 106 of the pillars 104 is exposed to the body contact area 120, and the spacer layer 112 remains along the outer portion 111 and the upper surface 110 of the pillars 104.

Figure 4A:
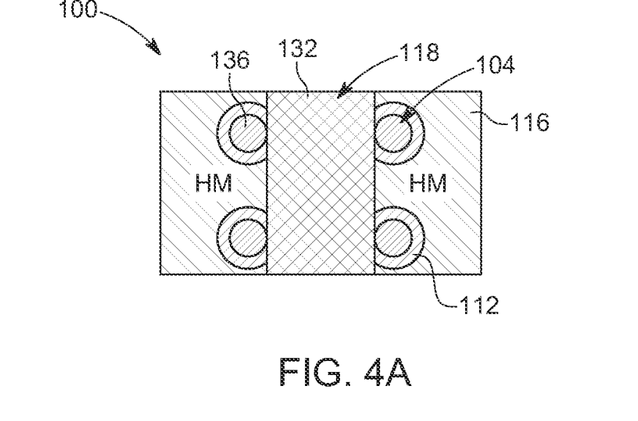
FIG. 4A illustrates a top view of the device following formation of a body contact and cap, according to embodiments of the present disclosure.
Figure 4B:
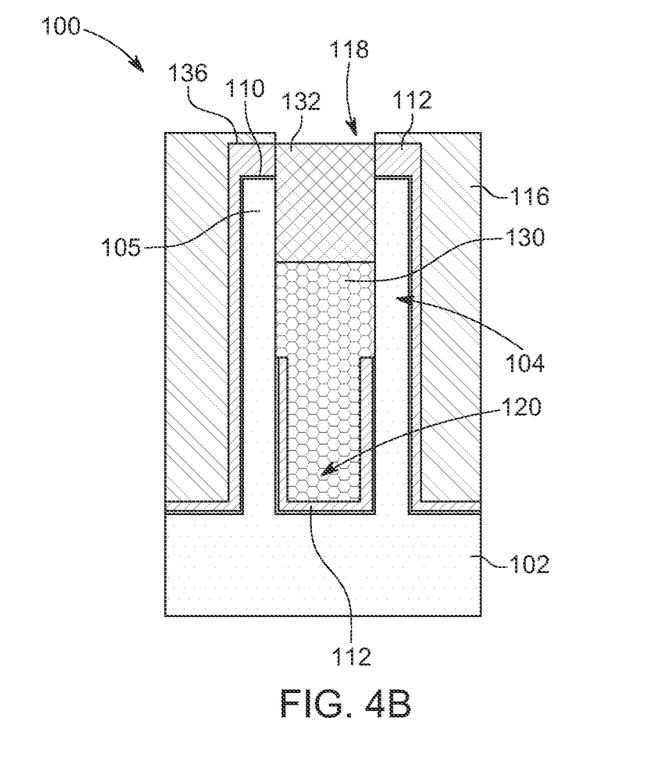
FIG. 4B illustrates a cross-sectional side view of the device of FIG. 4A, according to embodiments of the present disclosure.

FIGS. 4A-4B illustrate the device 100 following formation of a body contact 130 and cap 132, according to embodiments of the present disclosure. As shown, the body contact 130 may be formed between the pillars 104, in the body contact area 120, while the cap 132 may be deposited over the body contact 130. In some embodiments, the body contact 130 may be polysilicon, doped silicon, metal, or other low resistance materials for conductive purposes. Meanwhile, the cap 132 may be a dielectric material, such as SiN or $SiO_2$, or other dielectric materials. The body contact 130 may be formed atop the spacer layer 112 within the central trench 108, and may be in direct physical contact with the exposed sidewall 106 of the upper portion 105 of each of the pillars 104. The cap 132 may also be formed in direct physical contact with the exposed sidewall 106 of the upper portion 105 of each of the pillars 104. Although non-limiting, the cap 132 may be planar with an upper surface 136 of the spacer layer 112 along the upper portion 105 of the pillars 104.

Figure 5A:
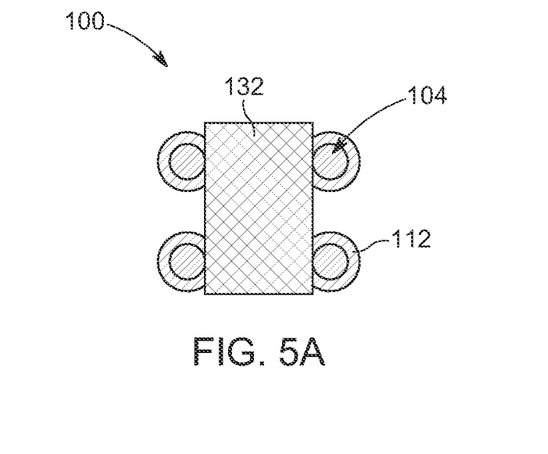
FIG. 5A illustrates a top view of the device following removal of the spacer layer from atop a substrate, according to embodiments of the present disclosure.
Figure 5B:
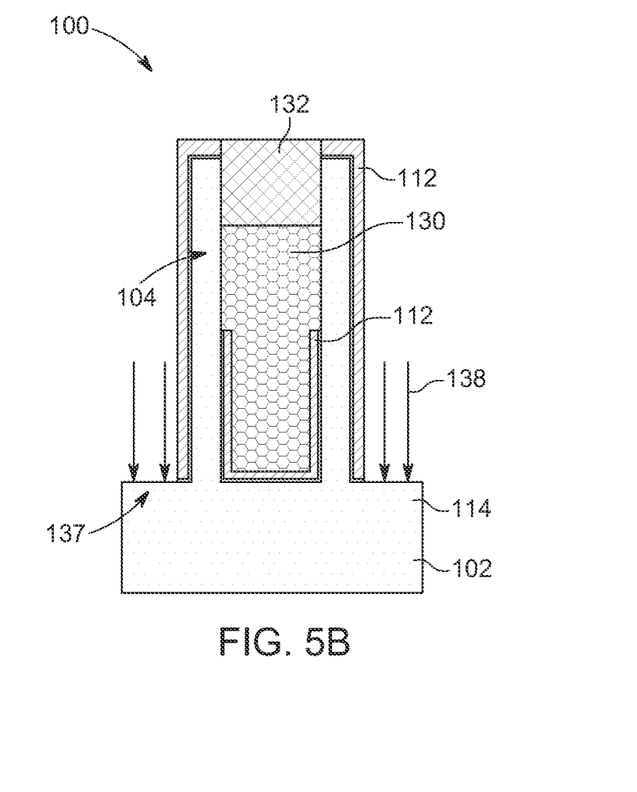
FIG. 5B illustrates a cross-sectional side view of the device of FIG. 5A, according to embodiments of the present disclosure.

FIGS. 5A-5B illustrate the device 100 following removal of the spacer layer 112 from atop the base layer 102, according to embodiments of the present disclosure. A vertical etch 138 may be used to remove the spacer layer 112 and to recess the upper surface 114 of the base layer 102. In some embodiments, the vertical etch 138 may be a dry etch operable to open a bottom S/D region 137 of the base layer 102.

Figure 6A:
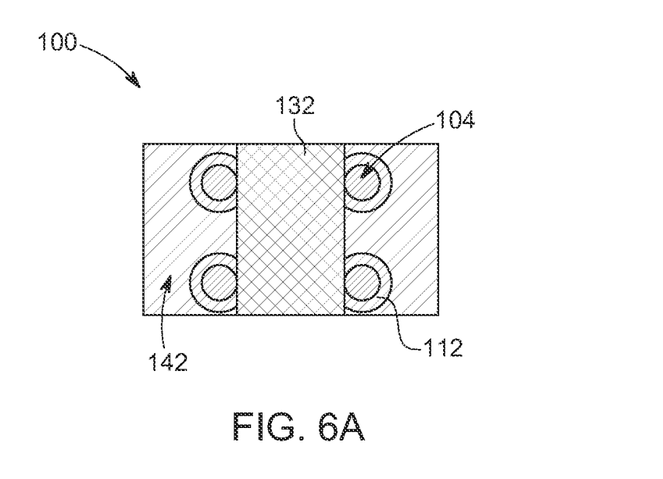
FIG. 6A illustrates a top view of the device following a bottom S/D doping and drive-in process, according to embodiments of the present disclosure.
Figure 6B:
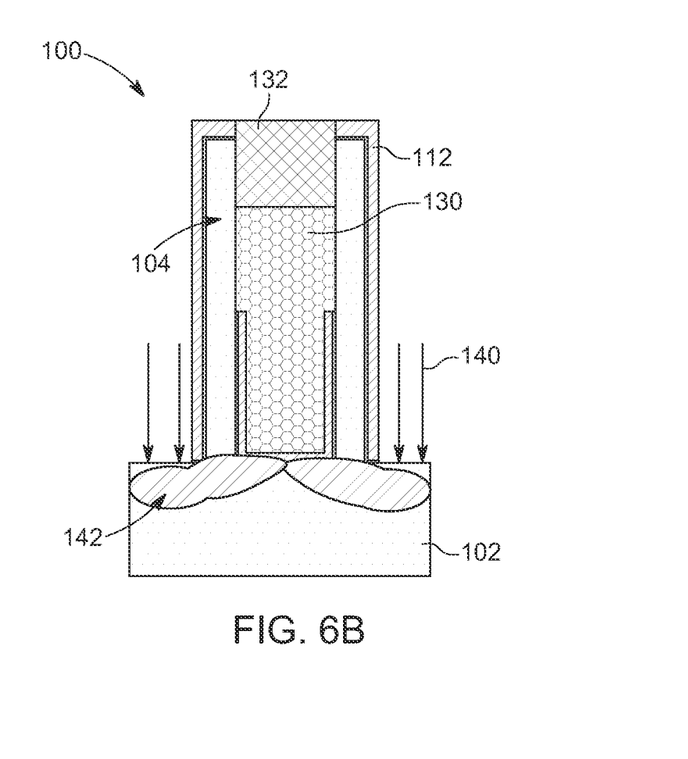
FIG. 6B illustrates a cross-sectional side view of the device of FIG. 6A, according to embodiments of the present disclosure.

FIGS. 6A-6B illustrate the device 100 following a S/D doping and thermal drive-in process 140, according to embodiments of the present disclosure. In some embodiments, multiple bottom S/D doping and drive-in steps may be performed to allow the dopant(s) to fully cover the pillar 104 and to contact the body contact 130 along a lower portion thereof, resulting in a bottom S/D 142 and a bitline being formed.

Figure 7A:
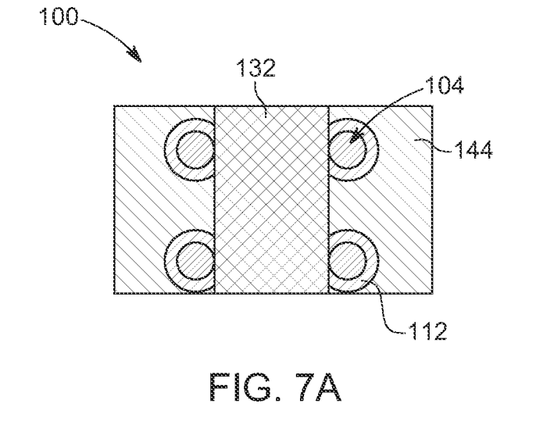
FIG. 7A illustrates a top view of the device following formation of a bottom spacer, according to embodiments of the present disclosure.
Figure 7B:
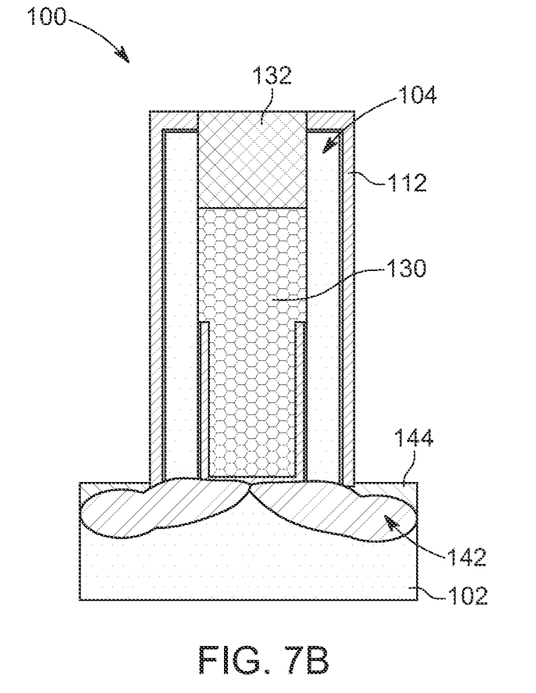
FIG. 7B illustrates a cross-sectional side view of the device of FIG. 7A, according to embodiments of the present disclosure.

FIGS. 7A-7B illustrate the device 100 following formation of a bottom spacer 144, according to embodiments of the present disclosure. As shown, the bottom spacer 144 may be formed over the bottom S/D 142, around the pillars 104.

Figure 8A:
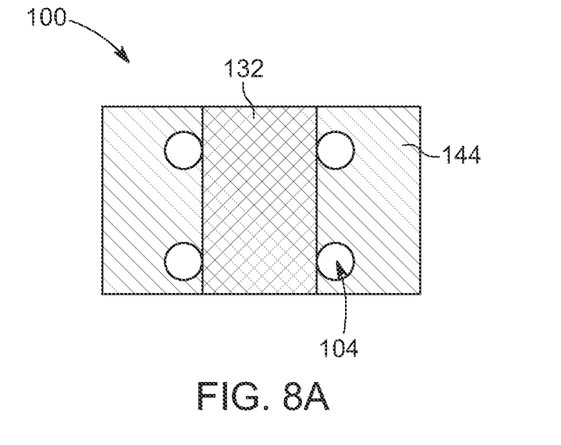
FIG. 8A illustrates a top view of the device following removal of the spacer layer, according to embodiments of the present disclosure.
Figure 8B:
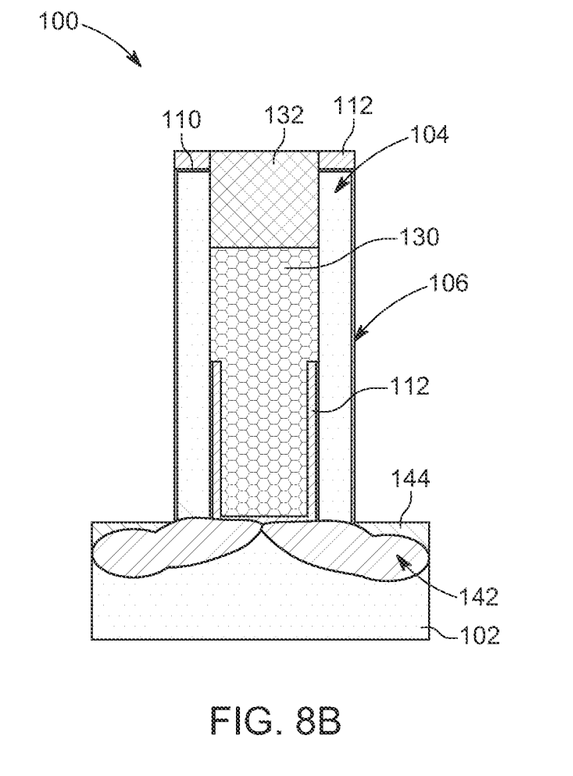
FIG. 8B illustrates a cross-sectional side view of the device of FIG. 8A, according to embodiments of the present disclosure.

FIGS. 8A-8B illustrate the device 100 following removal of the spacer layer 112 according to embodiments of the present disclosure. As shown, the spacer layer 112 may be removed from the sidewall 106 of the pillars 104. More specifically, the spacer layer 112 may be removed from the exterior portion 111 of each pillar 104 without being removed from the inner portion 109 of the pillars 104. In some embodiments, the spacer layer 112 may also remain along the upper surface 110 of the pillars 104.

Figure 9A:
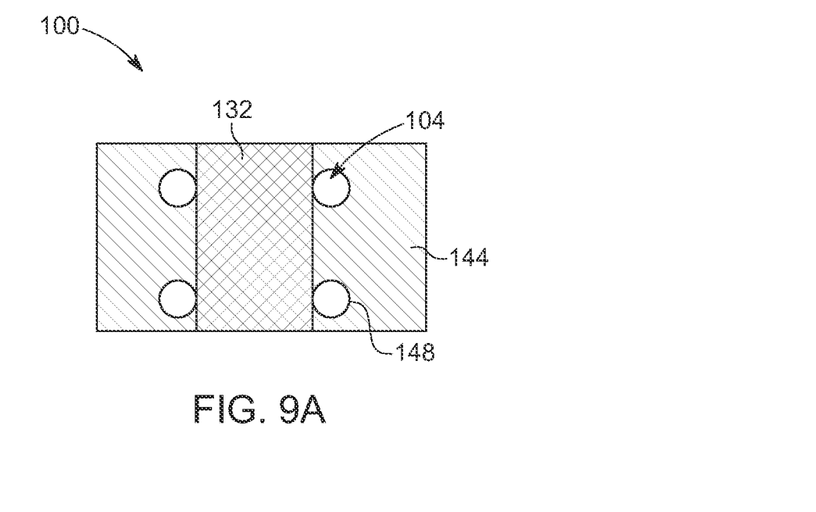
FIG. 9A illustrates a top view of the device following formation of a gate oxide, according to embodiments of the present disclosure.
Figure 9B:
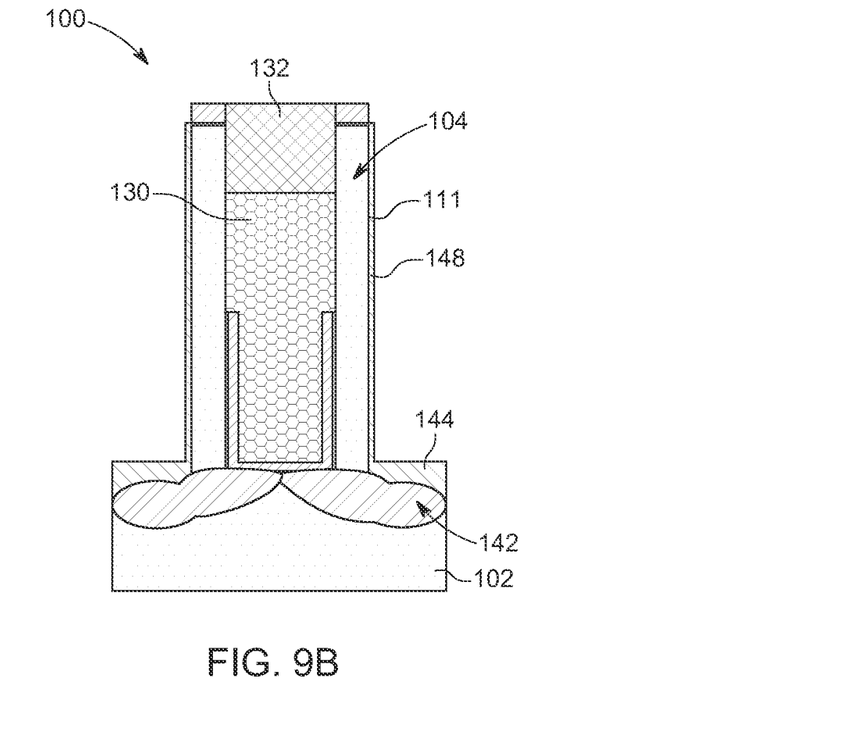
FIG. 9B illustrates a cross-sectional side view of the device of FIG. 9A, according to embodiments of the present disclosure.

FIGS. 9A-9B illustrate the device 100 following formation of a gate oxide 148 along the pillars 104, according to embodiments of the present disclosure. As shown, the gate oxide 148 may be formed along the exterior portion 111 of each pillar 104. The gate oxide 148 may generally connect with the bottom spacer 144.

Figure 10A:
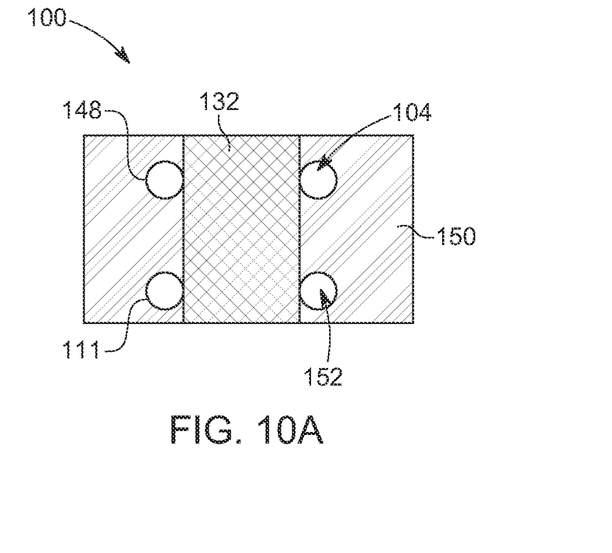
FIG. 10A illustrates a top view of the device following formation of a gate, according to embodiments of the present disclosure.
Figure 10B:
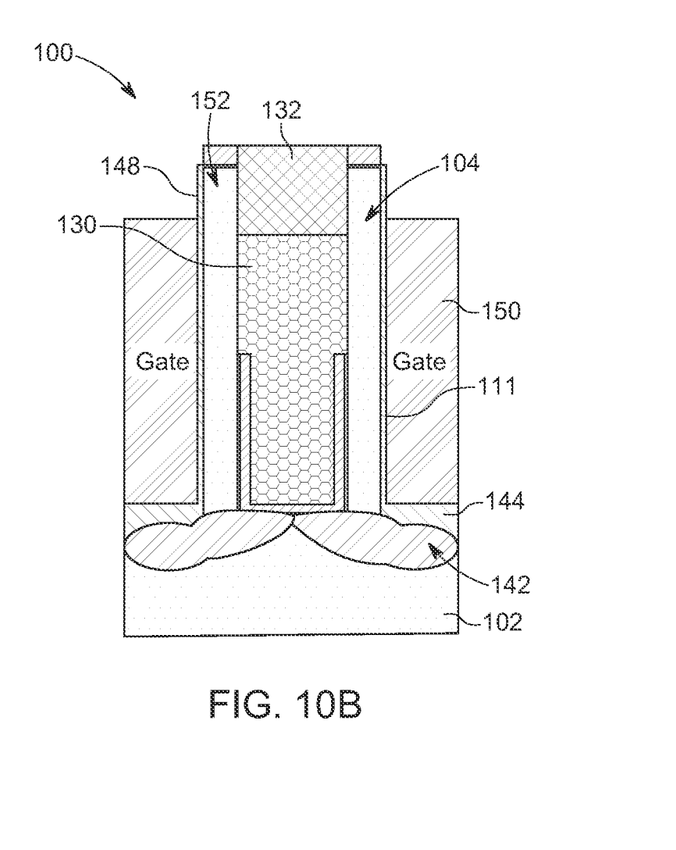
FIG. 10B illustrates a cross-sectional side view of the device of FIG. 10A, according to embodiments of the present disclosure.

FIGS. 10A-10B illustrate the device 100 following formation of a gate 150, according to embodiments of the present disclosure. As shown, the gate 150 may be formed atop the bottom spacer 144, and around the pillars 104 and the body contact 130. In some embodiments, the gate 150 may include multiple gates (e.g., one, two, or three). In some embodiments, the gate 150 does not extend to the upper surface 110 of the pillars 104. Instead, a portion 152 of the pillars 104 remains uncovered by the gate 150. The gate oxide 148 may separate the gate 150 from the pillars 104 along the exterior portion 111 of the pillars 104.

Figure 11A:
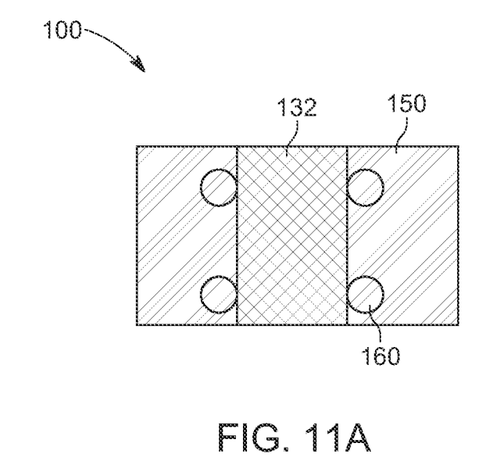
FIG. 11A illustrates a top view of the device following formation of a top S/D, according to embodiments of the present disclosure.
Figure 11B:
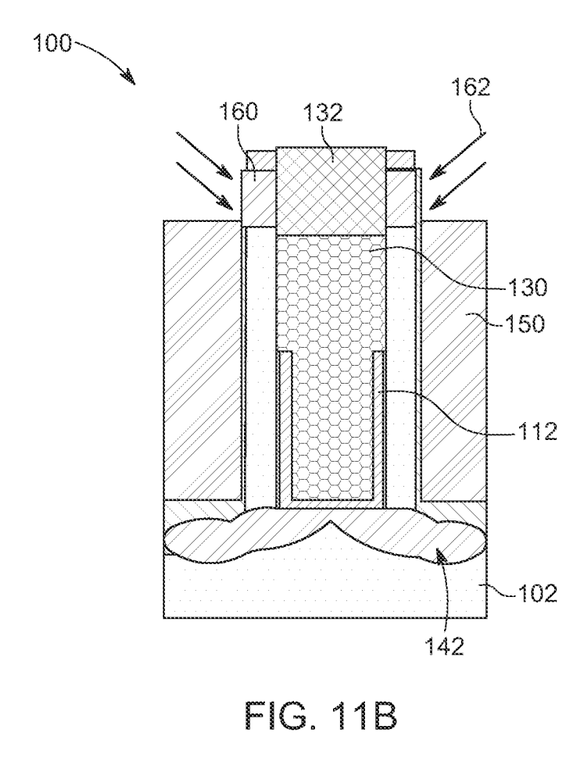
FIG. 11B illustrates a cross-sectional side view of the device of FIG. 11A, according to embodiments of the present disclosure.
Figure 12A:
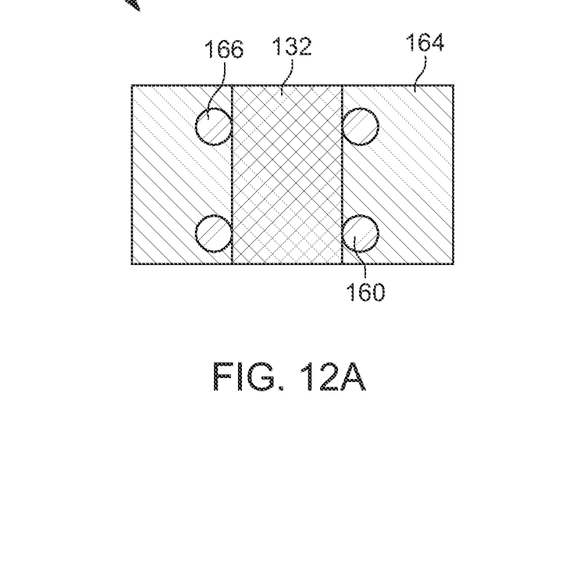
FIG. 12A illustrates a top view of the device following a dielectric fill process, according to embodiments of the present disclosure.
Figure 12B:
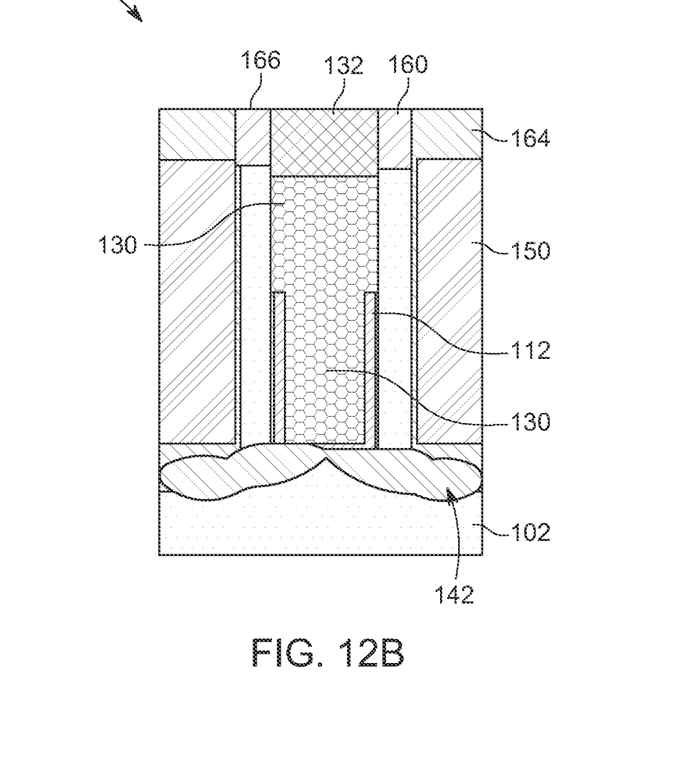
FIG. 12B illustrates a cross-sectional side view of the device of FIG. 12A, according to embodiments of the present disclosure.

FIGS. 11A-11B illustrate the device 100 following formation of an upper S/D 160, according to embodiments of the present disclosure. As shown, the exposed portion 152 of the pillars 104 may be doped 162 to form the upper S/D 160 within each of the pillars 104. The upper S/D 160 may also abut the cap 132 in some embodiments FIG. 12A-12B illustrate the device 100 following formation of a dielectric fill 164, according to embodiments of the present disclosure. Although non-limiting, the dielectric fill may be a silicon dioxide, which is deposited over the device 100 and then planarized selective to a top surface 166 of the upper S/D 160. The dielectric fill 164 may surround the upper S/D 160 and remain over the gate 150.

Figure 13:
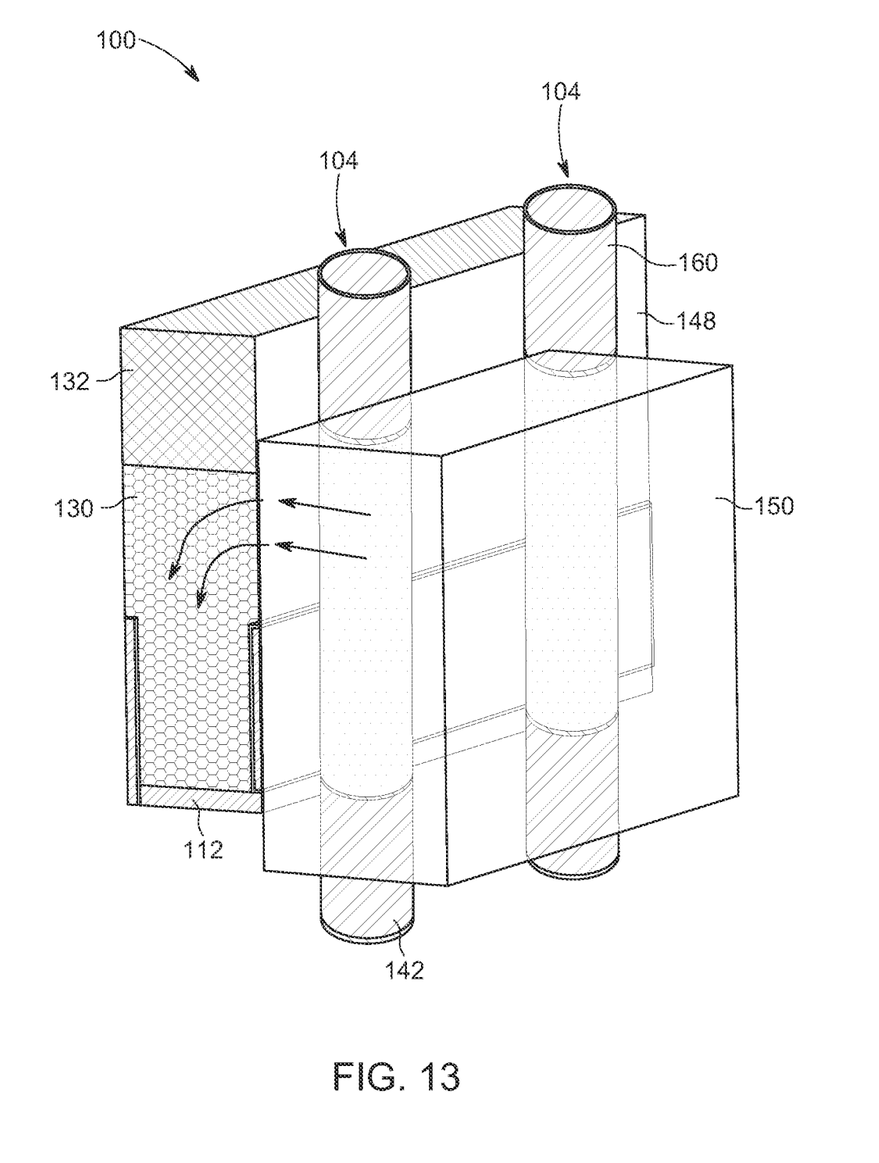
FIG. 13 illustrates a perspective view of the device, according to embodiments of the present disclosure.

FIG. 13 illustrates a perspective view of a portion of the device 100, according to embodiments of the present disclosure. As shown, the device 100 includes the plurality of pillars 104 extending from a substrate (not shown), the spacer layer 112 formed along just the lower portion of each of the plurality of pillars 104. The polysilicon body contact 130 and the cap 132 are formed between the plurality of pillars 104. As shown, the body contact 130 is formed over the spacer layer 112, and the polysilicon body contact 130 is in direct physical contact with the upper portion of each of the plurality of pillars 104. The gate 150 is formed around the plurality of pillars 104, and the bottom S/D 142 is formed in the substrate. The top S/D 160 is formed in the plurality of pillars 104, wherein the top S/D 160 extends above the gate 150, and wherein the bottom S/D extends below the gate 150. As further shown, the gate oxide 148 may separate the gate 150 from the polysilicon body contact 130. The arrows extending between the pillars 104 and the polysilicon body contact 130 demonstrate existence of a path for hole or electron to flow in and out, which eliminates floating-body issues in the device 100.

Figure 14:
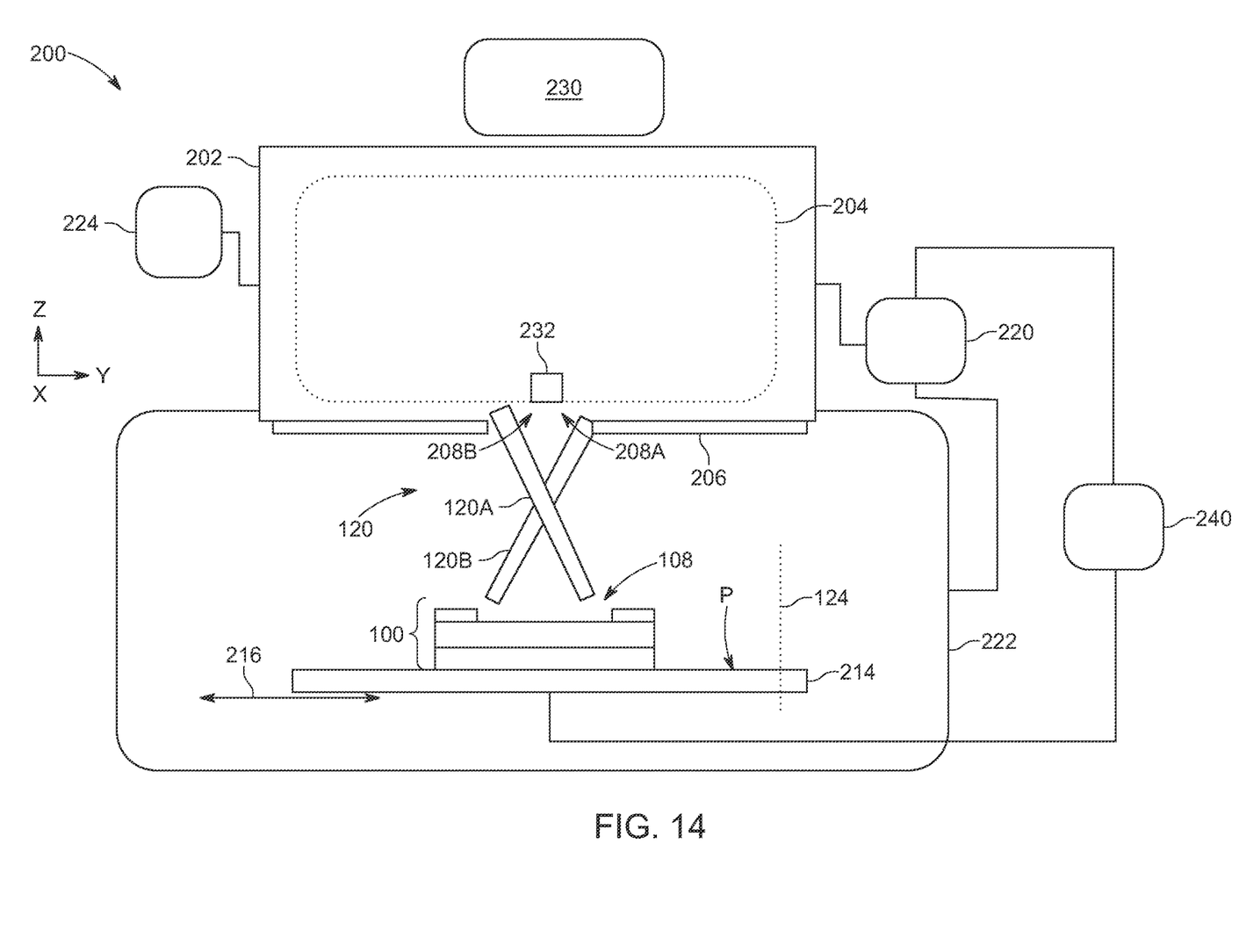
FIG. 14 illustrates a diagram of a processing apparatus according to embodiments of the present disclosure.

FIG. 14 depicts a side view of a processing apparatus 200 during ion beam processing of a substrate, in accordance with embodiments of the present disclosure. As to the general features of the processing apparatus 200, this apparatus represents a processing apparatus for selectively etching one or more layers of a device, such as selectively removing portions of the spacer layer 112, as described above. The processing apparatus 200 may be a plasma-based processing system having a plasma chamber 202 for generating a plasma 204 therein by any convenient method as known in the art. A power supply 230, may, for example, be an RF power supply to generate the plasma 204. An extraction plate 206 may be provided as shown, having an extraction aperture 208, where a selective etching may be performed to selectively remove sidewall layers. A substrate, such as a substrate 100 having the aforementioned structure as the device 100 shown at FIGS. 1A-2B, is disposed in the process chamber 222. A substrate plane of the substrate 100 is represented by the X-Y plane of the Cartesian coordinate system shown, while a perpendicular to the plane of the substrate 100 lies along the Z-axis (Z-direction).

As further shown, a controller 240 may be provided to send control signals to the bias supply 220 and to a substrate stage 214. In one example, the view of FIG. 14 may represent a variant of the selective etching operation shown in FIGS. 3A-3B, for example. During a directional etching operation, a plasma, such as a reactive plasma is formed using a reactive chemistry in the plasma chamber 202, and one or more angled ion beams 120A, 120B are extracted as a pair of ion beams, as shown. Although non-limiting, the processing apparatus 200 may include a beam blocker 232 disposed adjacent the extraction aperture 208. The beam blocker 232 is sized and positioned to define a first aperture 208A and a second aperture 208B, where the first aperture 208A forms the first angled ion beam 120A, and the second aperture 208B forms the second angled ion beam 120B. The two angled ion beams may define angles of incidence with respect to the perpendicular 124, equal in magnitude, opposite in direction. In one embodiment, the first angled ion beam 120A and the second angled ion beam 120B may represent an angled reactive ion beam. The beam blocker offset along the Z-axis with respect to extraction plate 206 may help define the angle of the angled ion beams.

In particular, as shown in FIG. 14, and with reference to the device 100 shown in FIGS. 3A-3B, the angled ion beams 120A-120B, each forming a non-zero angle of incidence with respect to the Z-axis (normal to the substrate plane), may strike the body contact area 120 in the central trench 108, between the pillars 104. As such, the first angled ion beam 120A and the second angled ion beam 120B may selectively etch the spacer layer 112 along the upper portion 105 of each of the pillars 104, while not etching the lower portion 107 of each of the pillars 104.

In this example, the angled ion beams 120A, 120B may be provided as a pair of ribbon ion beams that are formed by an elongated extraction aperture, extending to a beam width along the X-direction, where the beam width is adequate to expose an entire width of the substrate 100, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

The angled ion beams 120A, 120B may be extracted when a voltage difference is applied using a bias voltage source, shown as bias supply 220, between the plasma chamber 202 and substrate 100 as in known systems. The bias supply 220 may be coupled to the process chamber 222, for example, where the process chamber 222 and substrate 100 are held at the same potential. In various embodiments, the angled ion beams 120A, 120B may be extracted as a continuous beam or as a pulsed ion beam as in known systems. For example, the bias supply 220 may be configured to supply a voltage difference between plasma chamber 202 and process chamber 222, as a pulsed DC voltage, where the voltage, pulse frequency, and duty cycle of the pulsed voltage may be independently adjusted from one another. When configured in the shape of a ribbon beam, these angled ion beams may expose an entirety of the substrate 100 to reactive ion etching of the trenches distributed in devices across the substrate 100, by scanning the substrate stage 214 along the scan direction 216, as shown.

In various embodiments, the value of the non-zero angle of incidence may vary from 5 degrees to 85 degrees, while in some embodiments the value may range between 15 degrees and 60 degrees. The embodiments are not limited in this context. The angled ion beams 120a, 120B may be composed of any convenient gas mixture, including inert gas, reactive gas, and may be provided in conjunction with other gaseous species in some embodiments. Gas may be provided from a gas source 224, where the gas source 224 may be a gas manifold coupled to provide a plurality of different gases to the plasma chamber 202. In particular embodiments, the angled ion beams 120A, 120B and other reactive species may be provided as a predetermined etch recipe to the substrate 100 so as to perform a directed reactive ion etching of targeted sidewalls of patterning layers on substrate 100. The etch recipe may be selective with respect to the material of the pillars 104, so as to remove material of the spacer layer 112, while not etching the pillars 104, or etching the pillars 104 to a lesser extent.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A device, comprising:
 a plurality of pillars extending from a base layer;
 a spacer layer formed along a lower portion of each of the plurality of pillars;
 a body contact and a cap positioned between and touching the plurality of pillars, wherein the body contact is formed over the spacer layer;
 a gate formed around the plurality of pillars; and
 a bottom source/drain formed in the base layer and a top source/drain formed in each pillar of the plurality of pillars, wherein the top source/drain extends above the gate.

2. The device of claim 1, wherein the body contact is at least one of: polysilicon, doped silicon, metal, or other low resistance material, and wherein the cap is a dielectric.

3. The device of claim 2, wherein the dielectric is a silicon oxide or a silicon nitride.

4. The device of claim 1, further comprising a gate oxide formed over an exterior portion of the plurality of pillars, wherein the gate is formed over the gate oxide.

5. The device of claim 1, further comprising a dielectric fill over the gate; and
wherein the gate encloses the plurality of pillars.

6. The device of claim 5, wherein the dielectric fill is a silicon dioxide, and wherein the silicon dioxide surrounds the top source/drain.

7. The device of claim 1, further comprising a bottom spacer formed over the bottom source/drain.

8. A dynamic random-access memory device, comprising:
a plurality of pillars extending from a substrate;
a spacer layer formed along just a lower portion of each of the plurality of pillars;
a body contact and a cap positioned between and touching the plurality of pillars, wherein the body contact is formed over the spacer layer, and wherein the body contact is in direct physical contact with an upper portion of each of the plurality of pillars;
a gate formed around the plurality of pillars; and
a bottom source/drain formed in the substrate and a top source/drain formed in each pillar of the plurality of pillars, wherein the top source/drain extends above the gate.

9. The dynamic random-access memory device of claim 8, wherein the body contact is at least one of: polysilicon, doped silicon, metal, or other low resistance material, and wherein the cap is a dielectric material formed atop the body contact.

10. The dynamic random-access memory device of claim 9, wherein the dielectric material is a silicon oxide or a silicon nitride.

11. The dynamic random-access memory device of claim 8, further comprising a gate oxide formed over an exterior portion of the plurality of pillars, wherein the gate is formed over the gate oxide.

12. The dynamic random-access memory device of claim 8, further comprising a silicon dioxide fill over the gate; and
wherein the gate encloses the plurality of pillars.

13. The dynamic random-access memory device of claim 12, wherein the silicon dioxide fill surrounds the top source/drain.

14. The dynamic random-access memory device of claim 8, further comprising a bottom spacer formed over the bottom source/drain, wherein the bottom spacer surrounds the plurality of pillars and the body contact.

* * * * *